(12) United States Patent
Wu et al.

(10) Patent No.: US 7,710,132 B2
(45) Date of Patent: May 4, 2010

(54) METHOD FOR MAKING A CONDUCTIVE FILM AND A PROBE CARD USING THE SAME

(75) Inventors: Tung-Chuan Wu, Hsinchu (TW);
Min-Chieh Chou, Taipei (TW);
Hung-Yi Lin, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 105 days.

(21) Appl. No.: 12/032,169

(22) Filed: Feb. 15, 2008

(65) Prior Publication Data

US 2009/0091343 A1   Apr. 9, 2009

(30) Foreign Application Priority Data

Oct. 5, 2007   (TW) .............................. 96137385 A

(51) Int. Cl.
*G01R 31/02* (2006.01)
*H01R 43/00* (2006.01)

(52) U.S. Cl. ......................................... 324/754; 29/884

(58) Field of Classification Search ................ 324/754; 29/884

See application file for complete search history.

(56) References Cited

U.S. PATENT DOCUMENTS

| | | | |
|---|---|---|---|
| 4,027,925 A | | 6/1977 | Black et al. |
| 4,027,935 A | * | 6/1977 | Byrnes et al. ............... 439/289 |
| 5,476,211 A | | 12/1995 | Khandros |
| 6,433,565 B1 | * | 8/2002 | Desai et al. .................. 324/755 |
| 6,581,276 B2 | * | 6/2003 | Chung ........................... 29/825 |

FOREIGN PATENT DOCUMENTS

| | | |
|---|---|---|
| TW | 90107441 | 1/2003 |
| TW | 93107026 | 5/2007 |

* cited by examiner

*Primary Examiner*—Evan Pert
(74) *Attorney, Agent, or Firm*—WPAT., P.C.; Justin King

(57) ABSTRACT

A method for manufacturing a conductive film as well as the structure thereof and a probe card using the same are provided in the invention. The conductive film is substantially a stacked structure of a specific thickness formed by the adhering and stacking of at least a substrate in a vacuum environment by the use of surface processing and mechanical healing whereas each substrate has an array of metal micro-threads formed thereon, in which the plural metal micro-threads, each being wrapped in an insulating film, are arranged on the substrate to form the array in a unidirectional and single-layered manner by the use of a LIGA process and polymer thin film technology. In an exemplary embodiment, the insulating film can be a polymer thin film of high dielectric constant, being made of a material such as polydimethylsiloxane (PDMA) or polyimide (PI); and the metal micro-thread is made of a high conductivity and high strength Ni—Co alloy. Moreover, the so-formed conductive film can be cut into any desired dimensions by the use of an energy beam, such as laser beam, ion beam and plasma beam, etc. while combining the conductive film with a panel so as to be used for forming a probe card with large area detection ability that is low-cost, ease-to-maintain and capable of being adapted for wafers of various bonding pad arrangements.

20 Claims, 4 Drawing Sheets

METHOD FOR MAKING A CONDUCTIVE FILM AND A PROBE CARD USING THE SAME

FIELD OF THE INVENTION

The present invention relates to a method for manufacturing a conductive film and a probe card using the same, and more particularly, to a probe card capable of engaging more than one pin to a bonding pad that is adapted for wafer of various bonding pad arrangements.

BACKGROUND OF THE INVENTION

A probe card is an interface between an electronic test system and a semiconductor wafer. Its purpose is to provide an electrical path between the test system and the circuits on the wafer, thereby permitting the testing and validation of the circuits at the wafer level, usually before they are diced and packaged. That is, before hundreds of IC chips fixed on a wafer are diced into chips with a few square millimeters, "Wafer Test" should be performed utilizing such probe card to check quality of IC chips and thus screen out defectives. However, as semiconductor manufacturers continue to shrink die geometries, which makes the task of on-wafer testing increasingly more difficult since pitches between bonding pads are becoming minute. Probe card with innovative solutions, which can perform a wafer level probing test on multiple chips on a wafer at once or even on the whole wafer, are required to meet the semiconductor industry's test needs so as to ensure higher accuracy and repeatable wafer testing and thus increase yield as well as lower cost.

Probe cards are broadly classified into cantilever type, vertical type, and MEMS (Micro Electro-Mechanical System) type depending on shape and forms of contact elements. The cantilever type is represented by the epoxy ring probe card, the vertical type is represented by the cobra probe card, and the MEMS type is usually used for DRAM (dynamic random access memory) testing.

Among which, although the cantilever type probe cards are usually designed with fine pitch as small as 40 µm, it is only suitable for testing those wafers 100, 200 with bonding pads 110, 210 configured at the edges thereof, as shown in FIG. 1 and FIG. 2, so that the pin count of such cantilever type probe card is limited and thus it is classified as low-end probe card. As for the vertical type probe card, it is originated from a manufacturing process disclosed in 1977 in U.S. Pat. No. 4,027,935, entitled "Contact for an electrical contactor assembly", in which a vertical probe head disclosed has each of ifs probes buckle or deflect when a predetermined axial load is applied thereto for enabling the same force to be exerted on each of a plurality of pads on a semiconductor chip as it is being tested. However, although such vertical type probe card is adapted for testing wafers 300 with a plurality of bonding pads arranged as arrays and is classified as high-end probe card with high pin count, it is bottlenecked for designing such vertical type probe card with pitch as small as 100 µm. Therefore, such vertical type probe cards are only good for testing flip chip packaged IC.

It is noted that each pin in the foregoing two types of probe card are manufactured in a manner that it is fixed onto a PCB (printed circuit board) manually. Thus, their manufacturing cost is closely related to their pin counts, i.e. the higher the pin count is, the higher the manufacturing cost will be.

The MEMS type probe card for DRAM is exemplified in the U.S. Pat. No. 5,476,211, entitled "Method of manufacturing electrical contacts, using a sacrificial member", and the U.S. Pat. No. 5,476,211, entitled "Method of making and using lithographic contact springs". However, it is disadvantageous in that its manufacturing process is complex and it is bottlenecked for designing such MEMS type probe card with pitch smaller than 70 µm, thereby, such MEMS type probe can be very expensive. In addition, it is limited to be used for testing wafers with bonding pad arrangement similar to that shown in FIG. 1.

Over all, those currently available probe cards are all capable of performing wafer testing in a "one pin corresponding to one pad" manner, so that it is required to redesign its pin configuration for matching wafers of various bonding pad arrangements. In addition, the pin pitches of those currently available probe cards are limited by their manufacturing processes, which might not be able to meet the challenge of ultra fine pitch up to those smaller than 70 µm, high pin counts and full wafer testing. There are already some studies trying to deal with shortcomings, such as high cost, pins of large volume, and restricted shape, etc, that are common for those conventional probe cards as they are usually manufactured by mold casting, drawing or roll milling. Such studies can be exemplified by the probe card manufacturing methods disclosed in TW Pat. No. 90107441 and TW Pat. No. 93107026. However, such studies still limited in the aforesaid "one pin corresponding to one pad" manner, and thus suffer the same shortcomings. Therefore, it is in need of a new probe card that not only is not troubled by the aforesaid fine pitch bottleneck, but also can be configured with high pin count and manufactured at low cost.

SUMMARY OF THE INVENTION

The object of the present invention is to provide a method for manufacturing a conductive film and a probe card using the same, that can produce a low-cost, ease-to-maintain probe card with large area detection ability that is adapted for wafers of various bonding pad arrangements.

To achieve the above object, the present invention provides a method for manufacturing a conductive film, comprising the steps of: sequentially forming a first insulating layer, a first metal layer and a photoresist layer on a substrate; forming a plurality of grooves on the photoresist layer while enabling each groove to channel though two opposite edges of the photoresist layer; forming a second metal layer inside each groove while electrically coupling the second metal layer with the first metal layer; removing the photoresist layer; removing the portion of the first metal layer that is not covered by the second metal layer so as to form an array of metal micro-threads; forming a second insulating layer on the array of metal micro-threads for incorporating the second insulating layer with the first insulating layer to from an insulating film wrapping the metal micro-threads; peeling off the insulating film along with the micro-threads wrapped therein from the substrate so as to form an metal micro-thread unit; and stacking and adhering a plurality of the aforesaid metal micro-thread units to form a conductive film of a specific thickness.

In an exemplary embodiment of the invention, the insulating film is substantially a polymer thin film of high dielectric constant, being made of a material such as polydimethylsiloxane (PDMA) or polyimide (PI).

In an exemplary embodiment of the invention, the metal micro-thread is made of a material of high conductivity and high strength, such as Ni—Co alloy.

In an exemplary embodiment of the invention, the aspect ratio of each micro-thread is high and is configured with a wire diameter no larger than 4 µm.

In an exemplary embodiment of the invention, the pitch between any two neighboring micro-threads is not larger than 10 μm.

In an exemplary embodiment of the invention, the cross section of each micro-thread can be shaped like a rectangle or a square.

In an exemplary embodiment of the invention, the stacking and adhering of the plural micro-thread units into a film of the specific thickness is performed by a surface processing and mechanical healing procedure.

In an exemplary embodiment of the invention, the mechanical healing procedure in performed in a vacuum environment.

In an exemplary embodiment of the invention, the micro-threads in the stacking micro-thread units are arranged parallel to each other.

In an exemplary embodiment of the invention, the method for manufacturing a conductive film further comprises a step of: dicing the conductive film into pieces of a specific dimension; and the dicing can be performed by the use of an energy beam, such as laser beam, ion beam and plasma beam, etc.

In an exemplary embodiment of the invention, the substrate is a silicon wafer.

In an exemplary embodiment of the invention, the first and the second metal layers are nano-scaled thin metal film, being made of a material selected from the group consisting of nickel, copper and a Ni—Co alloy of high conductivity and high strength.

In an exemplary embodiment of the invention, the plural grooves on the photoresist layer is formed by a means selected from the group consisting of: a means of direct etching using an energy beam, and a means of indirect etching through a mask using an energy beam; and such energy beam can be a laser beam, an ion beam or a plasma beam.

In an exemplary embodiment of the invention, the plural grooves are arranged parallel to each other in a unidirectional and single-layered manner.

Moreover, to achieve the above object, the present invention provides a conductive film, being formed by adhering and stacking a plurality of micro-thread units into a film with a specific thickness; wherein each of the plural micro-thread units is substantially an array of micro-threads, wrapped in an insulating film while enabling the micro-threads in the array being arranged in a unidirectional and single-layered manner.

In addition, to achieve the above object, the present invention provides a conductive film type probe card, comprising: at least a conductive film, each being formed by adhering and stacking a plurality of micro-thread units into a film with a specific thickness; a panel, provided for the at least one conductive film to coupled therewith; and a circuit board, for driving the panel; wherein each of the plural micro-thread units is substantially an array of micro-threads, wrapped in an insulating film while enabling the micro-threads in the array being arranged in a unidirectional and single-layered manner.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

Please refer to FIG. 4A to FIG. 4H, which show sequentially the manufacturing of a conductive film, each representing a step in the manufacturing process. The manufacturing of the conductive film makes use of many micro/nano-technologies, such as micro/nano-scaled polymer film formation, LIGA process, and micro electroforming technology and the like.

Figure 1:
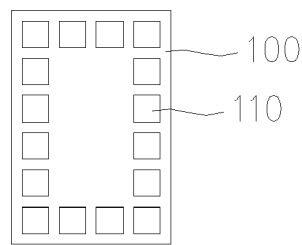
FIG. 1 to FIG. 3 show three different bonding pad arrangements on a wafer in respective.
Figure 2:
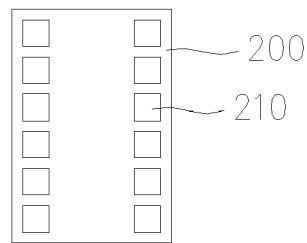
Figure 3:
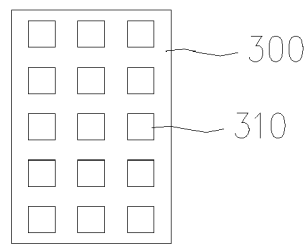
Figure 4A:
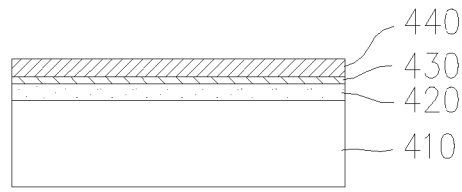
FIG. 4A to FIG. 4H show sequentially the manufacturing of a conductive film, each representing a step in the manufacturing process.

In FIG. 4A, a silicon substrate 410 is provided, on which a micro scaled polymer film, made of a material such as PDMS or PI, is first being coated and used as a first insulating layer 420; and then on the first insulating layer 420, a nano-scaled metal layer, made of a metal such as nickel or copper, is formed by sputtering or electroless plating and used as a first metal layer 430; and thereafter, on the first metal layer 430, a photoresist layer 440 is formed.

Figure 4B:
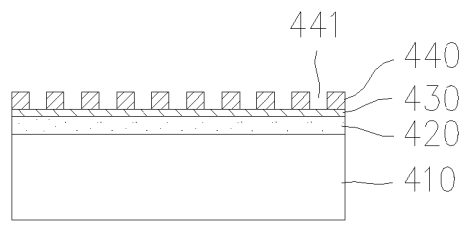
Figure 5:
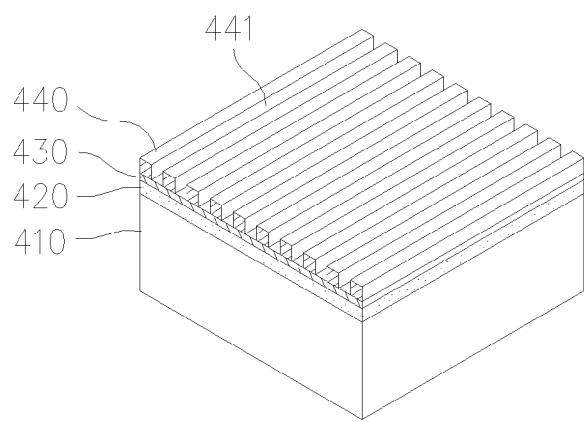
FIG. 5 is a schematic diagram showing a photoresist layer of a conductive film having a plurality of grooves formed therein.

In FIG. 4B, a plurality of grooves 441 on the photoresist layer 440 by the use of a energy beam, such as a laser beam, an ion beam, or a plasma beam, in a direct etching manner or through a mask. Please refer to FIG. 5, is a schematic diagram showing a photoresist layer of a conductive film having a plurality of grooves formed therein. As shown in FIG. 5, the plural grooves 441 are arranged parallel to each other in a unidirectional and single-layered manner while enabling each groove 441 to channel through two opposite edges of the photoresist layer 440.

Figure 4C:
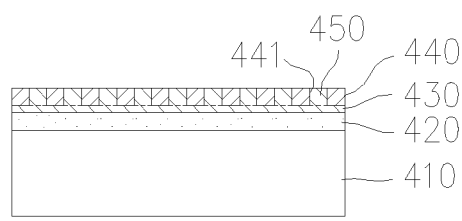

In FIG. 4C, a second metal layer 450 is formed in each groove 441 by electroplating. It is noted that the second metal film 450 is made of a metal of high conductivity and high strength, such as a Ni—Co alloy; and it is configured for electrically coupling with the first metal layer 430.

Figure 4D:
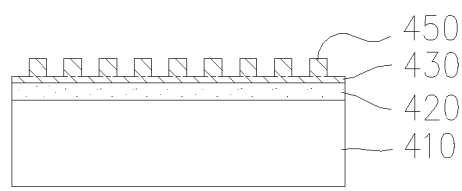

In FIG. 4D, the photoresist layer 440 is removed.

Figure 4E:
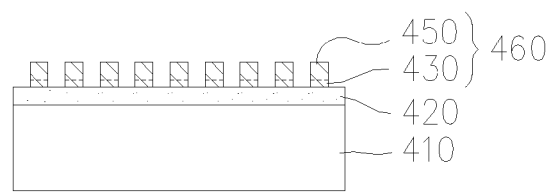

In FIG. 4E, the portion of the first metal layer 430 that is not covered by the second metal layer 450 is removed by etching so as to form a plurality of metal micro-threads 460. As shown in FIG. 4D, the cross section of each micro-thread 460 is shaped like a rectangle. However, it can be shaped like a square or other geometrical shapes as it is dependent on the thicknesses of first metal and the second metal layers 430, 450.

Figure 4F:
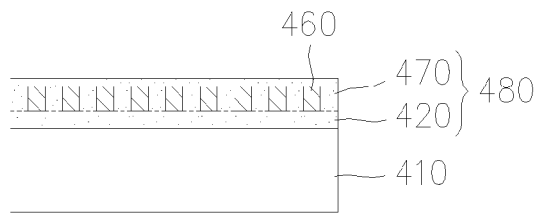

In FIG. 4F, the plural micro-threads 460 is covered by a second insulating layer 470 while enabling the second insulating layer 470 to combine with the first insulating layer 420 to form an insulating film 480 in a manner that the insulating film 481 wraps the plural micro-threads 460 therein.

Figure 4G:
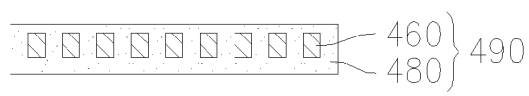

In FIG. 4G, the insulating film 480 is detached from the substrate 410 and along with it, the plural micro-threads 460 are also being peeled, by which a metal micro-thread unit 490 is established. The aspect ratio of each micro-thread 460 is high and is configured with a wire diameter no larger than 4 μm. In addition, the pitch between any two neighboring micro-threads is not larger than 10 μm.

Figure 4H:
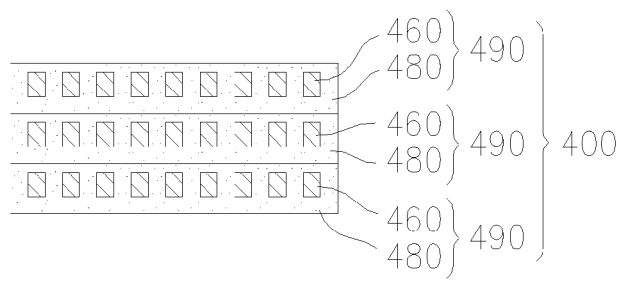
Figure 6:
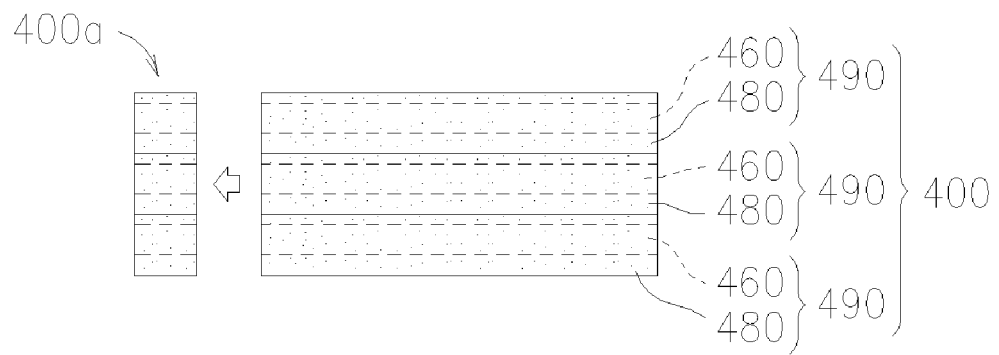
FIG. 6 is a cross sectional view of a diced conductive film.

In FIG. 4H, after the formation of such metal micro-thread units is completed, a conductive film 400 of a specific thickness, formed by the adhering and stacking of at least one such metal micro-thread unit 490 in a vacuum environment by the use of surface processing and mechanical healing, is formed. As shown in FIG. 4H and FIG. 6, the micro-threads 460 in the stacking micro-thread units 490 are arranged parallel to each other. Furthermore, the so-formed conductive film 400 can be diced into pieces 400a of a specific dimension; and the dicing can be performed by the use of an energy beam, such as laser beam, ion beam and plasma beam, etc.

Figure 7:
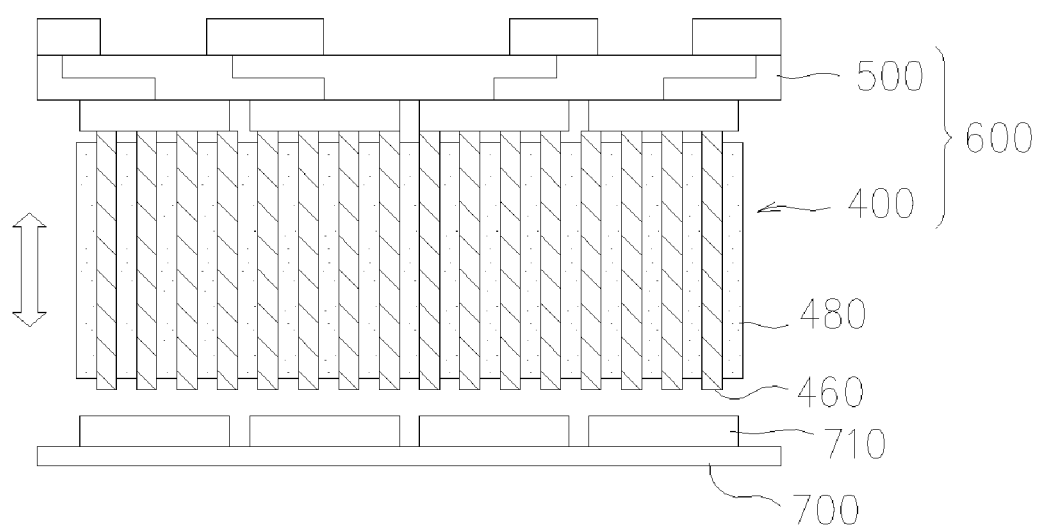
FIG. 7 shows a probe card adapted for wafer testing, being a conductive film coupling with a panel.

Please refer to FIG. 7, which shows a probe card adapted for wafer testing, being a conductive film coupling with a panel. It is noted that the conductive film 400 can be attached to the bottom of a panel 500 by means of hooking, wedging or adhering, by which a conductive film type probe card 600 can be formed. As the panel 500 is electrically connected to a circuit board which is used for driving the panel 500 to move, the moving panel will bring along the conductive film 400 to move and thus to engage or disengage with bonding pads 710 of a wafer 700. However, the array of parallel-arranged linear micro-threads 460 shown in FIG. 7 is only an exemplary embodiment of the invention, which is not limited thereby. The conductive film 400 disclosed in the invention is characterized in that: as each metal micro-thread 460 is wrapped inside the insulating film 480 while having its two ends extending outside the two opposite edges of the insulating film 480 by a specific length, as shown in FIG. 7, such design is beneficiary for the micro-thread to engage with the bonding pads 710. Nevertheless, since the insulating film 480 is flexible, even when the micro-thread 460 are completely wrapped inside the insulating film 480, the panel 500 can be compressed for extruding the micro-threads 460 so as to facilitate the same to engage with the bonding pads 710.

Moreover, as the metal micro-thread unit 490 is manufacturing by the use of many micro/nano-technologies, such as micro/nano-scaled polymer film formation, LIGA process, and micro electroforming technology and the like. Micro-threads 460 of various aspect ratios can be formed, which is configured with a wire diameter no larger than 4 μm; and the pitch between any two neighboring micro-threads is not larger than 10 μm. It is known that the dimension of a common bonding pad 710 is about 70×70 μm. Thus, the so-formed probe card is capable of engaging more than one pin to one bonding pad 710, even when the size of future bonding pad is reduced to smaller then 25 μm. Moreover, the probe card of the invention is capable of being adapted for wafers of various bonding pad arrangements, that there is no need to design probe cards specifically for different IC chips. Yet, the method of the present is especially good for manufacturing probe cards for future full wafer testing since it adopts flexible film design, as describe hereinbefore, so that no only it requires no assembly, but also it do not need to worry about the pin count and area limitations troubling those conventional probe cards.

To sum up, the film type probe card disclosed in the invention is a low-cost, ease-to-maintain probe card with large area detection ability that not only is capable of engaging more than one pin to a bonding pad, but also is adapted for wafers of various bonding pad arrangements. It is emphasized that the process for manufacturing a conductive film, as shown sequentially in FIG. 4A to FIG. 4H, is only an exemplary embodiment of the invention. Other variations using micro/nano-technologies, such as micro/nano-scaled polymer film formation, LIGA process, and micro electroforming technology and the like, are not to be regarded as a departure from the spirit and scope of the invention.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for manufacturing a conductive film, comprising the steps of:
   sequentially forming a first insulating layer, a first metal layer and a photoresist layer on a substrate;
   forming a plurality of grooves on the photoresist layer;
   forming a second metal layer inside each groove while electrically coupling the second metal layer with the first metal layer;
   removing the photoresist layer;
   removing the portion of the first metal layer that is not covered by the second metal layer so as to form an array of metal micro-threads;
   forming a second insulating layer on the array of metal micro-threads for incorporating the second insulating layer with the first insulating layer to from an insulating film wrapping the metal micro-threads;
   peeling off the insulating film along with the micro-threads wrapped therein from the substrate so as to form an metal micro-thread unit; and
   stacking and adhering a plurality of the aforesaid metal micro-thread units to form a conductive film of a specific thickness.

2. The method of claim 1, wherein each groove is configured to channel though two opposite edges of the photoresist layer.

3. The method of claim 1, wherein each of the first and the second insulating films is substantially a polymer thin film of high dielectric constant, being made of a material selected from the group consisting of polydimethylsiloxane (PDMA), polyimide (PI) and the like.

4. The method of claim 1, wherein the metal micro-thread is made of a material of high conductivity and high strength, one of which being a Ni—Co alloy.

5. The method of claim 1, wherein the stacking and adhering of the plural micro-thread units into a film of the specific thickness is performed by a surface processing and mechanical healing procedure.

6. The method of claim 1, wherein the micro-threads in the stacking micro-thread units are arranged parallel to each other.

7. The method of claim 1, further comprising a step of:
   dicing the conductive film into pieces of a specific dimension.

8. The method of claim 7, wherein the dicing is performed by the use of an energy beam selected from the group consisting of a laser beam, a ion beam, a plasma beam, and the like.

9. The method of claim 1, wherein the substrate is a silicon wafer.

10. The method of claim 1, wherein the first and the second metal layers are nano-scaled thin metal film, being made of a material selected from the group consisting of nickel, copper and a Ni—Co alloy of high conductivity and high strength.

11. The method of claim 1, wherein the plural grooves on the photoresist layer is formed by a means selected from the group consisting of: a means of direct etching using an energy beam, and a means of indirect etching through a mask using an energy beam; and such energy beam can be a laser beam, an ion beam or a plasma beam.

12. The method of claim 1, wherein the plural grooves are arranged parallel to each other in a unidirectional and single-layered manner.

13. A conductive film, being formed by adhering and stacking a plurality of micro-thread units into a film with a specific thickness;
wherein each of the plural micro-thread units is substantially an array of micro-threads, wrapped in an insulating film while enabling the micro-threads in the array being arranged in a unidirectional and single-layered manner;
wherein the pitch between any two neighboring micro-threads is not larger than 10 μm.

14. The conductive film of claim 13, wherein the insulating film is substantially a polymer thin film of high dielectric constant, being made of a material selected from the group consisting of polydimethylsiloxane (PDMA), polyimide (PI) and the like.

15. The conductive film of claim 13, wherein the metal micro-thread is made of a material of high conductivity and high strength, one of which being a Ni—Co alloy.

16. The conductive film of claim 13, wherein the micro-threads in the stacking micro-thread units are arranged parallel to each other.

17. A probe card, comprising:
at least a conductive film, each being formed by adhering and stacking a plurality of micro-thread units into a film with a specific thickness;
a panel, provided for the at least one conductive film to coupled therewith; and
a circuit board, for driving the panel;
wherein each of the plural micro-thread units is substantially an array of micro-threads, wrapped in an insulating film while enabling the micro-threads in the array being arranged in a unidirectional and single-layered manner;
wherein a wafer with a plurality of pads formed thereon is electrically coupled to the panel though the micro-threads corresponding to each of the pads.

18. The probe card of claim 17, wherein the insulating film is substantially a polymer thin film of high dielectric constant, being made of a material selected from the group consisting of polydimethylsiloxane (PDMA), polyimide (PI) and the like.

19. The probe card of claim 17, wherein the metal micro-thread is made of a material of high conductivity and high strength, one of which being a Ni—Co alloy.

20. The probe card of claim 17, wherein the micro-threads in the stacking micro-thread units are arranged parallel to each other and the pitch between any two neighboring micro-threads is not larger than 10 μm.

* * * * *